United States Patent [19]
Klatt

[11] Patent Number: 5,029,731
[45] Date of Patent: Jul. 9, 1991

[54] PROCESS AND APPARATUS FOR DOSING AND APPLYING LIQUID OR PASTY MEDIA TO AN OBJECT

[76] Inventor: Helmuth Klatt, Eichenallee 62, D-1000 Berlin 19, Fed. Rep. of Germany

[21] Appl. No.: 418,138

[22] Filed: Oct. 6, 1989

Related U.S. Application Data
[63] Continuation-in-part of Ser. No. 234,203, Aug. 18, 1988, abandoned.

[30] Foreign Application Priority Data

Aug. 20, 1987 [DE] Fed. Rep. of Germany ....... 3728054

[51] Int. Cl.⁵ .................... B05C 11/00; G01F 23/00
[52] U.S. Cl. ................................ 222/54; 222/61; 222/389; 118/694
[58] Field of Search ............ 222/54, 61, 64, 389, 222/67, 387; 118/688, 694, 708; 239/71, 73, 74, 75, 322, 321; 427/96

[56] References Cited

U.S. PATENT DOCUMENTS

| | | | |
|---|---|---|---|
| 3,347,418 | 10/1967 | Fefferman | 222/61 |
| 4,599,219 | 7/1986 | Cooper et al. | 73/57 |
| 4,741,736 | 5/1988 | Brown | 604/67 |
| 4,765,509 | 8/1988 | Eisenhut et al. | 222/389 |
| 4,900,593 | 2/1990 | Krippl | 118/694 |

FOREIGN PATENT DOCUMENTS 8603366 6/1986 PCT Int'l Appl. ................... 427/96

Primary Examiner—Andres Kashnikow
Assistant Examiner—Karen B. Merritt
Attorney, Agent, or Firm—Basile and Hanlon

[57] ABSTRACT

A process and an apparatus for dosing and applying liquid or pasty media to an object are disclosed. A dosing apparatus filled with the liquid or pasty medium is positioned relative to the object. The dispenser-like dosing apparatus is pressurized with a pressure surge, so that the dosing apparatus plunger is displaced and the medium ejected. The filling level of the medium in the dosing apparatus is determined by means of a filling level sensor and pressurization is modified as a function of the filling level.

9 Claims, 2 Drawing Sheets

PROCESS AND APPARATUS FOR DOSING AND APPLYING LIQUID OR PASTY MEDIA TO AN OBJECT

REFERENCE TO RELATED APPLICATION

This application is a continuation in part of my prior U.S. application Ser. No. 07/234,203, filed Aug. 18, 1988, now abandoned.

BACKGROUND OF THE INVENTION

1. Field of the Invention

The invention relates to a process and to an apparatus for dosing and applying liquid or pasty media to an object.

2. Description of the Relevant Art

Surface Mount Device (SMD) technology has been increasingly used of late for the construction of circuit boards. In this technology the SMD devices are directly soldered to the contact areas or lands on the circuit board; soldering paste being applied to the lands prior to insertion. This, for example, takes place in screen printing using a screen having the pattern of the lands. The soldering paste is applied to the screen where it passes through the screen openings and on to the circuit board where the devices are subsequently fixed to the soldering paste. In another process the devices are fixed by an adhesive to the circuit board and are then soldered in a wave (solder) bath. The adhesive points are applied with a dosing device or dispenser, which comprises an adhesive-filled cartridge, having a cannula and plunger, which is pneumatically or hydraulically operated. The adhesive quantity is controlled as a function of the pressure and the time.

The disadvantage of applying the soldering paste by screen process printing is that it is very complicated and costs are high. It is necessary to produce large batches of circuit boards, which have to be stored, and the screens must be separately produced and must be cleaned and checked after use.

Due to the disadvantages of the screen process, a process for applying the soldering paste by means of a dispenser, in which the latter is moved over a positioning table to the desired point and pressure surges are applied to the dispenser plunger, is often used. In the case of known dimensions of the dispenser and constant pressure, it is possible to dose the discharge quantity by means of the duration of the pressure surges. However, it has been found that the dosing is not accurate enough, because of the ever larger air space in the dispenser which causes the pressure surges to be damped through the displacement of the plunger and consequently the application quantity is influenced.

The above shortcomings are addressed by the design of the present invention.

SUMMARY OF THE INVENTION

The present invention provides a process and an apparatus for dosing and applying liquid or paste media to an object comprising a medium-filled dosing apparatus, positionable relative to the object, and pressurized whereby by means of a control and regulating unit, the pressurization is controlled so that preselected medium doses are supplied. The medium filling level in the dosing apparatus is determined, and pressurization modified, as a function of the filling level.

Due to the fact that the filling level in the dosing apparatus, constructed as a dispenser, is determined and the pressurization of the plunger is varied in predetermined manner as a function of the filling level, it is possible to accurately determine the quantity of adhesive or soldering paste discharged. It is particularly advantageous that the temperature of the adhesive or the soldering paste is kept constant in the dosing apparatus. This allows constant viscosity conditions to be obtained thereby eliminating the need to compensate for the viscosity variable. As such the dosing apparatus is heated or cooled.

A particularly simple and inexpensive filling level sensor involves the use of a small magnet, which is inserted in the cartridge or dispenser in close proximity to, and movable with, the plunger which cooperates with at least one magnetic field scanner arranged in the immediate vicinity of the dispenser to indicate the level of medium in the dispenser.

The dosing apparatus utilizes a cannula which slopes with respect to the circuit board surface. As such, the adhesive or soldering paste can flow or be pressed out in unimpeded manner from the opening, without the latter being blocked or impeded by the circuit board.

Other objects and features of the invention will become apparent by reference to the following specification and to the drawing.

DESCRIPTION OF THE PREFERRED EMBODIMENT

Figure 1:
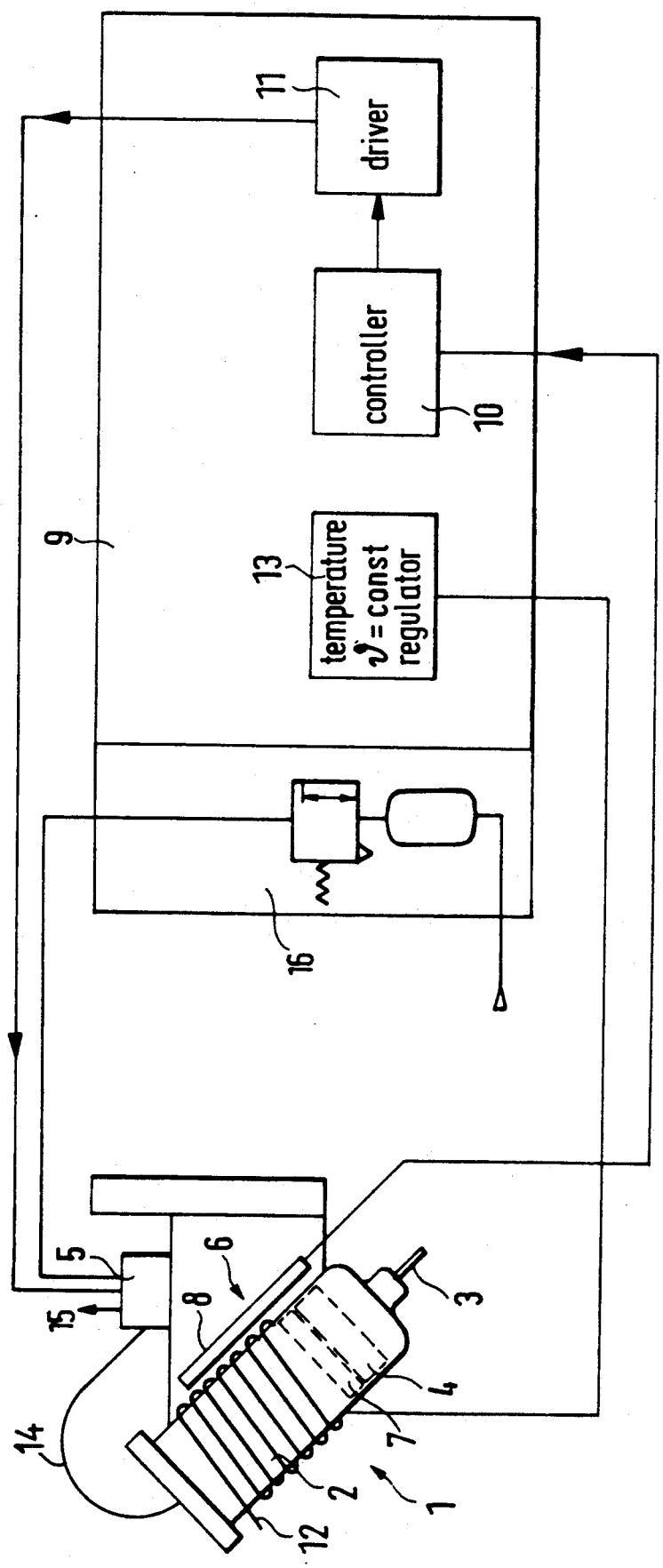
FIG. 1 is a schematic view of the apparatus of the present invention.

In FIG. 1, there is shown an apparatus for dosing and application of an adhesive or soldering paste to the lands of circuit boards which comprises a dispenser-like dosing apparatus 1, having a cartridge 2 for receiving the soldering paste or adhesive and a cannula 3 fitted thereto. In the cartridge 2 is located a plunger 4, which is preferably pneumatically pressurized. The head space of cartridge 2 above plunger 4 is connected, via a pressure line 14, to a valve means 5, which normally vents the head space of the cartridge 2 and when actuated supplies pressurized air at constant pressure to the head space of cartridge 2 to drive plunger 4 to express media from canula 3.

Figure 2:
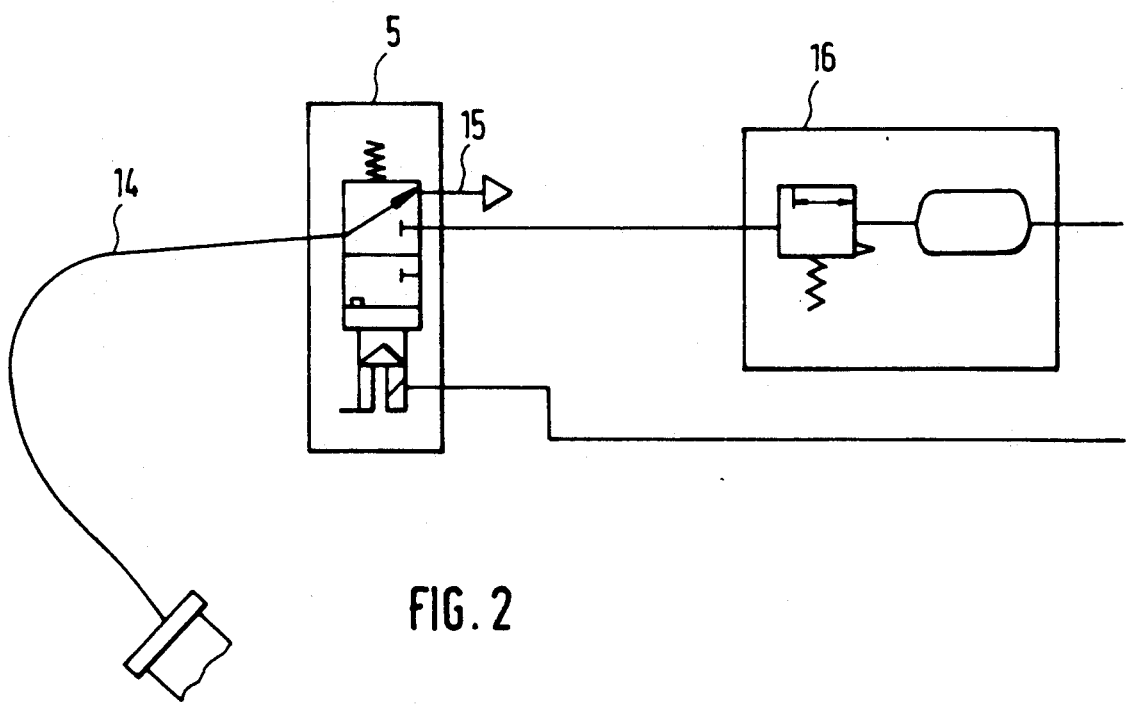
FIG. 2 is a schematic view of a valve employed in the apparatus of FIG. 1.

As seen in FIG. 2 the valve means 5 is a solenoid actuated three way valve which selectively connects pressure line 14 to a source of air 16 under constant pressure when the solenoid is actuated and connects line 14 to a vent 15 when the solenoid is deactuated.

With dosing apparatus 1 is associated a filling level sensor 6, which comprises a magnet 7, arranged in the cartridge 2 mounted on the plunger 4, and a magnetic field scanner 8. The magnetic field scanner 8 may comprise, for example, several coils, which are distributed over the length of the cartridge in the immediate vicinity thereof. The scanner 8 is connected, by means of a signal conditioning circuit (not shown), to a control and regulating unit 9, having a computer 10. The latter stores the coordinates of the lands to be provided with the adhesive or soldering paste, as well as information regarding the adhesive or soldering paste quantities to be applied to said lands. On the basis of the pressure supplied to the plunger 4 and the information concerning the discharge quantity, the computer 10 calculates the dosing time, (i.e., the time for which a pressure surge is to be applied to the plunger 4).

Additionally, the computer 10 stores correction curves, which are used in modifying the dosing time for specific discharge quantities, as a function of the fill level of the adhesive or soldering paste in the cartridge 2. Computer 10 is connected to a dosing valve actuating means 11, which electrically drives the dosing valve 5.

Cartridge 2 is mounted and received in a metal jacket, preferably of aluminum, which contains heating means 12 in the form of a heating coil or the like. The heating means 12 is connected to a temperature regulator 13, which maintains the cartridge 2, and its contents, at a desired constant temperature.

Dosing apparatus 1 is arranged in a head of a positioning table and is displaceable in at least three axes (X, Y and Z-axis). The dosing apparatus 1 is fixed in a sloping manner in the head of the positioning table. In other words, cannula 3 slopes with respect to the circuit board, so that the soldering paste discharged from cannula 3 reaches the circuit board land in an unimpeded manner and is not impeded by the actual circuit board.

For discharging soldering paste onto predetermined lands, the positioning table is moved into the desired X-Y position of the land on the circuit board; being controlled by the computer 10. In another embodiment, the dosing apparatus can be fixed and the circuit board moved. The head of the positioning table with the dosing apparatus is lowered by means of a valve (not shown), so that the opening of cannula 3 is positioned in a sloping orientation over the circuit board land. The magnetic field of magnet 7 in cartridge 2 is detected by the magnetic field scanner 8 and on the basis of its output signals the soldering paste level in the cartridge 2 is determined by the computer 10.

The discharge quantity depends on the elasticity, the viscosity, the compressibility, the volume of the pressurized air column and the adhesion.

The dosing time is calculated by the computer 10 under consideration of these parameters, and the desired soldering paste quantity whereby the pressure of the pressurized air supplied to the head space of the cartridge 2 is constant. The viscosity of the soldering paste quantity is kept constant by means of the temperature regulator 13 and the heating means 12. The elasticity is known as a medium to discharge is taken into account by a delay time being a programmable parameter. The compressibility of the air at the given working pressure and working temperature is set to be constant. Only the volume of the pressurized air column is a variable which will increase in accordance with the time interval over which the head space is connected to air supply 16. After having determined the dosing time which generally lies between 20 and 500 ms, under consideration of the given parameters and the volume of the pressurized air column measured indirectly by means of the magnet 7 on the plunger 4 and the magnetic field scanner 8, the controller 10 generates a signal and the dosing valve actuating means 11 activates the solenoid of the three way valve 5, which connects the pressure line 14 with the air supply 16 and a pressure surge is applied to the plunger 4.

This pressure surge leads to a movement of plunger 4 and magnet 7 and soldering paste is forced through the cannula 3 onto the circuit board land. After the computed dosing time the actuating means 11 deactivates the solenoid which disconnects the air supply 16 and the pressure line 14 and connects the pressure line 14 to the vent 15. Thus, the head space of the cartridge 2 is vented, terminating the dispensing of the soldering paste. The positioning table head with the dosing apparatus then moves upwards. This process is repeated for each land. However, it is not necessary to monitor the filling level after each dosing process, because the position of the plunger and magnet only changes slightly.

The above-described embodiment is a preferred embodiment, but obviously variants are possible. The filling level sensors can be constituted by random displacement sensors, such as those of a capacitive or optical nature. It is also possible to use potentiometers with a resistance varying over the cartridge length, or differential transformers.

In the embodiment shown in the drawing, the soldering paste is kept at a constant temperature by a heating means 12. However, it is also conceivable to keep the temperature constant using a cooling means such as a Peltier component, or to determine the temperature of the soldering paste and for the computer 10 to take account of the viscosity by varying the different temperatures when calculating the dosing time.

Additionally, it is also possible to modify the intensity of the pressure surges, for example, by means of a servovalve, instead of changing the duration thereof as a function of the filling level.

In the embodiment, the invention has been described as a process and apparatus for applying soldering paste in SMD technology. However, different other uses are possible. For example, soldering paste can be applied to materials to be randomly contacted and tin-plated. The invention can also be used where components, such as screws are to be secured with an adhesive or the like, or where casings are to be bonded or other mechanical connections made. Further, the invention can be used in the electronic industry for applying masking lacquers or markings on electronic elements.

While one embodiment of the invention has been described in detail above, in relation to a process and apparatus for dosing and applying liquid or pasty media to an object, it will be readily apparent to those skilled in the art that the disclosed embodiment may be modified.

Therefore, the foregoing description is considered exemplary, rather than limiting, and the true scope of the invention is that defined in the following claims.

What is claimed is:

1. Apparatus for dispensing a dose of preselected volume of a liquid or pasty media, said apparatus comprising cartridge means including a piston like plunger received within an axially extending cartridge for movement axially of said cartridge, a media dispensing opening at one end of said cartridge, said cartridge containing a supply of media within said cartridge between said plunger and said opening and having an enclosed head space within said cartridge between said plunger and the opposite end of said cartridge, valve means normally operable to vent said head space and actuable to connect said head space to a source of gas under pressure, fill-level sensing means for generating a signal representative of the axial position of said plunger within said cartridge, computer means operatively connected to said sensing means and operable in accordance with said signal to actuate said valve means to apply a computer regulated pressure surge to said head space driving said plunger to express a dose of said preselected volume of media from said opening.

2. The invention defined in claim 1 further comprising temperature regulating means for maintaining the media in said cartridge at a constant temperature.

3. The invention defined in claim 1 wherein said computer means computes a time interval in accordance with the pressure at which gas is supplied by said valve means to said head space and the volume of said head space as represented by said signal to vary the pressure surge applied to said plunger during actuations of said valve means in a manner such that said predetermined volume of media is dispensed for all actuations of said valve means, regardless of the position of said plunger at the initiation of the actuation.

4. The invention defined in claim 1 wherein said cartridge includes a cannula at said end defining said dispensing opening adapted to be inclined to the vertical during a dispensing operation.

5. In a process for dispensing a preselected dose of a liquid or pasty media from a cartridge by applying a charge of gas under pressure to the head space in the cartridge above the media to discharge media from a discharge opening in the cartridge;
the method of regulating the pressure charge applied to the cartridge head space comprising the steps of:
1. selecting the volume of media to constitute the dose to be discharged;
2. measuring the volume of the head space
3. connecting the head space of said cartridge to a source of gas under pressure to expel media from said cartridge through said discharge opening until the volume of said head space has been increased by said selected volume of said dose,
4. and venting said head space to terminate the discharge of said media.

6. An apparatus for dispensing a dose of preselected volume of a liquid or pasty media, said apparatus comprising:
cartridge means including a piston-like plunger received within an axially extending cartridge for movement axially of said cartridge;
a media dispensing opening at one end of said cartridge, said cartridge containing a supply of media within said cartridge between said plunger and said opening and having an enclosed head space within said cartridge between said plunger and the opposite end of said cartridge;
valve means normally operable to vent said head space and actuable to connect said head space to a source of gas under pressure;
fill-level sensing means for generating a signal representative of the axial position of said plunger within said cartridge;
computer means operatively connected to said sensing means and operable in accordance with said signal to actuate said valve means to apply a computer regulated pressure surge to said head space driving said plunger to express a dose of said preselected volume of media from said opening; and
temperature regulating means for maintaining the media in said cartridge at a constant temperature.

7. The invention defined in claim 6 wherein said computer means computes a time interval in accordance with the pressure at which gas is supplied by said valve means to said head space and the volume of said head space as represented by said signal to vary the pressure surge applied to said plunger during actuations of said valve means in a manner such that said predetermined volume of media is dispensed for all actuations of said valve means, regardless of the position of said plunger at the initiation of the actuation.

8. The invention defined in claim 7 wherein said cartridge includes a cannula at said end defining said dispensing opening adapted to be inclined to the vertical during a dispensing operation.

9. An apparatus for dispensing a dose of preselected volume of a liquid or pasty media, said apparatus comprising cartridge means including an axially extending cartridge for movement axially of said cartridge;
a media dispensing opening at one end of said cartridge wherein said cartridge includes a cannula at said end defining said dispensing opening adapted to be inclined to the vertical during a dispensing operation, said cartridge further containing a supply of media within said cartridge between said plunger and said opening and having an enclosed head space within said cartridge between said plunger and the opposite end of said cartridge;
valve means normally operable to vent said head space and actuable to connect said head space to a source of gas under pressure;
fill level sensing means for generating a signal representative of the axial position of said plunger within said cartridge;
computer means operatively connected to said sensing means and operable in accordance with said signal to actuate said valve means to apply a computer regulated pressure surge to said head space driving said plunger to express a dose of said preselected volume of media from said opening; and
temperature regulating means for maintaining the media in said cartridge at a constant temperature;
wherein said computer means computes a time interval in accordance with the pressure at which gas is supplied by said valve means to said head space and the volume of said head space as represented by said signal to vary the pressure surge applied to said plunger during actuations of said valve means in a manner such that said predetermined volume of media is dispensed for all actuations of said valve means, regardless of the position of said plunger at the initiation of the actuation.

* * * * *